US009196753B2

(12) United States Patent
Ramaswamy et al.

(10) Patent No.: US 9,196,753 B2
(45) Date of Patent: Nov. 24, 2015

(54) SELECT DEVICES INCLUDING A SEMICONDUCTIVE STACK HAVING A SEMICONDUCTIVE MATERIAL

(75) Inventors: D. V. Nirmal Ramaswamy, Boise, ID (US); Gurtej Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 998 days.

(21) Appl. No.: 13/089,648

(22) Filed: Apr. 19, 2011

(65) Prior Publication Data

US 2012/0267632 A1 Oct. 25, 2012

(51) Int. Cl.
| | |
|---|---|
| *H01L 27/108* | (2006.01) |
| *H01L 29/872* | (2006.01) |
| *H01L 27/28* | (2006.01) |
| *H01L 45/00* | (2006.01) |
| *H01L 27/102* | (2006.01) |
| *H01L 29/885* | (2006.01) |
| *H01L 27/22* | (2006.01) |
| *H01L 27/24* | (2006.01) |
| *G11C 11/56* | (2006.01) |
| *G11C 13/00* | (2006.01) |

(52) U.S. Cl.
CPC .......... *H01L 29/872* (2013.01); *H01L 27/1021* (2013.01); *H01L 27/224* (2013.01); *H01L 27/2409* (2013.01); *H01L 27/285* (2013.01); *H01L 29/885* (2013.01); *H01L 45/04* (2013.01); *H01L 45/06* (2013.01); *H01L 45/1233* (2013.01); *H01L 45/141* (2013.01); *H01L 45/146* (2013.01); *H01L 45/147* (2013.01); *H01L 45/16* (2013.01); *G11C 11/5678* (2013.01); *G11C 13/0004* (2013.01); *G11C 2213/71* (2013.01)

(58) Field of Classification Search
CPC .......... G11C 13/0004; G11C 2213/71; G11C 11/5678; H01L 45/1233; H01L 27/285
See application file for complete search history.

(56) References Cited

U.S. PATENT DOCUMENTS

| | | | |
|---|---|---|---|
| 4,227,203 A | 10/1980 | Mikoshiba | |
| 4,845,533 A * | 7/1989 | Pryor et al. | 257/4 |
| 6,528,358 B1 | 3/2003 | Yamazaki et al. | |

(Continued)

FOREIGN PATENT DOCUMENTS

| | | |
|---|---|---|
| CN | 101132052 A | 2/2008 |
| JP | 2007505479 A | 3/2007 |

(Continued)

OTHER PUBLICATIONS

International Search Report and Written Opinion for related PCT Application No. PCT/US2012/030904, mailed Oct. 23, 2012, (12 pgs.).

(Continued)

*Primary Examiner* — Phat X Cao
*Assistant Examiner* — Diana C Vieira
(74) *Attorney, Agent, or Firm* — Brooks, Cameron & Huebsch, PLLC

(57) ABSTRACT

Methods, devices, and systems are provided for a select device that can include a semiconductive stack of at least one semiconductive material formed on a first electrode, where the semiconductive stack can have a thickness of about 700 angstroms (Å) or less. Each of the at least one semiconductive material can have an associated band gap of about 4 electron volts (eV) or less and a second electrode can be formed on the semiconductive stack.

31 Claims, 2 Drawing Sheets

(56) References Cited

U.S. PATENT DOCUMENTS

| | | | |
|---|---|---|---|
| 7,122,842 B2 | 10/2006 | Hill | |
| 7,303,971 B2* | 12/2007 | Hsu et al. | 438/381 |
| 7,446,010 B2* | 11/2008 | Li et al. | 438/328 |
| 7,608,514 B2* | 10/2009 | Hsu et al. | 438/288 |
| 7,754,600 B2* | 7/2010 | Kobayashi et al. | 438/630 |
| 7,968,419 B2* | 6/2011 | Li et al. | 438/381 |
| 8,017,952 B2 | 9/2011 | Cho et al. | |
| 8,023,318 B2 | 9/2011 | Hwang et al. | |
| 8,088,688 B1* | 1/2012 | Herner | 438/658 |
| 8,320,160 B2* | 11/2012 | Nazarian | 365/148 |
| 8,374,018 B2* | 2/2013 | Lu | 365/148 |
| 8,391,049 B2* | 3/2013 | Jo | 365/148 |
| 8,404,553 B2* | 3/2013 | Herner et al. | 438/382 |
| 8,441,835 B2* | 5/2013 | Jo et al. | 365/148 |
| 8,450,209 B2* | 5/2013 | Herner | 438/658 |
| 8,450,710 B2* | 5/2013 | Clark | 257/2 |
| 8,599,601 B2* | 12/2013 | Jo et al. | 365/148 |
| 8,624,293 B2* | 1/2014 | Bandyopadhyay et al. | 257/104 |
| 8,659,933 B2* | 2/2014 | Jo | 365/148 |
| 8,906,725 B2 | 12/2014 | Moffatt | |
| 2004/0241466 A1 | 12/2004 | Chang et al. | |
| 2005/0157549 A1 | 7/2005 | Mokhlesi et al. | |
| 2007/0001201 A1 | 1/2007 | Kil et al. | |
| 2007/0015348 A1* | 1/2007 | Hsu et al. | 438/570 |
| 2007/0170446 A1 | 7/2007 | Cho et al. | |
| 2008/0150425 A1 | 6/2008 | Cho et al. | |
| 2008/0296565 A1 | 12/2008 | Park et al. | |
| 2010/0061142 A1* | 3/2010 | Arita et al. | 365/148 |
| 2010/0093126 A1 | 4/2010 | Yun et al. | |
| 2010/0135061 A1 | 6/2010 | Li et al. | |
| 2010/0202193 A1* | 8/2010 | Goux et al. | 365/163 |
| 2010/0264397 A1 | 10/2010 | Xia et al. | |
| 2012/0033479 A1* | 2/2012 | DeLucca et al. | 365/148 |

FOREIGN PATENT DOCUMENTS

| | | |
|---|---|---|
| JP | 2013-514667 A | 4/2013 |
| JP | 2013512572 A | 4/2013 |
| KR | 20070074257 A | 7/2007 |
| KR | 20010005986 A | 1/2010 |

OTHER PUBLICATIONS

Notice of Rejection Ground from related Japanese patent application No. 2014-506420, dated Jul. 18, 2014, 4 pp.

Office Action from related Taiwan patent application No. 101112670, dated Jun. 17, 2014, 10 pp.

Kringhoj, et al., "Solid-Phase Epitaxial Crystallization of Strain-Relaxed Si1-xGex Alloy Layers", Physical Review Letters, The American Physical Society, vol. 73, No. 6, Aug. 8, 1994, pp. 858-861.

Vanhellemont, et al., "On the Impact of Germanium Doping on the Vacancy Formation Energy in Czochralsk-grown Silicon", Journal of Applied Physics, vol. 108, No. 1, Jul. 13, 2010, 3 pp.

Extended Search Report from related European patent application No. 12774630.3, dated Feb. 9, 2015, 7 pp.

Office Action from Korean patent application No. 10-2013-7029471, dated Jan. 8, 2015, 21 pp.

First Office Action from related Chinese patent application No. 201280019479.2 dated Aug. 4, 2015, 12 pp.

* cited by examiner

SELECT DEVICES INCLUDING A SEMICONDUCTIVE STACK HAVING A SEMICONDUCTIVE MATERIAL

TECHNICAL FIELD

The present disclosure relates generally to semiconductor electronic devices and methods, and more particularly, select devices.

BACKGROUND

Memory devices are typically provided as internal, semiconductor, integrated circuits in computers or other electronic devices. There are many different types of memory including volatile and non-volatile memory. Volatile memory can require power to maintain its information and includes random-access memory (RAM), dynamic random access memory (DRAM), and synchronous dynamic random access memory (SDRAM), among others. Non-volatile memory can provide persistent information by retaining stored information when not powered and can include NAND flash memory, NOR flash memory, read only memory (ROM), Electrically Erasable Programmable ROM (EEPROM), Erasable Programmable ROM (EPROM), phase change random access memory (PCRAM), resistive random access memory (RRAM), and magnetic random access memory (MRAM), such as spin torque transfer random access memory (STT RAM), among others.

Select devices can be coupled to memory cells. Select devices can be used as a switch, in which the transistor is either fully-on or fully-off. Fully-on has a voltage across the transistor of almost zero and the transistor is "saturated" as it cannot pass any more current. Examples of select devices include thin film transistors (TFTs). TFTs commonly use silicon film. Generally, polycrystalline silicon materials have been widely used as semiconductor materials for TFTs because they have a high field-effect mobility and can be applied to high speed circuits and constitute complementary metal oxide semiconductor (CMOS) circuits. TFTs using polycrystalline silicon materials can be used as active elements of active-matrix liquid crystal display (AMLCD) devices and switching and driving elements of organic light emitting diodes (OLEDs).

Methods of crystallizing an amorphous silicon material into a polycrystalline silicon material include solid phase crystallization (SPC), excimer laser crystallization (ELC), metal induced crystallization (MIC) and metal induced lateral crystallization (MILC). SPC is a method of annealing an amorphous silicon material for several to several tens of hours at a temperature at or below the transition temperature of the glass used as a substrate of a display device employing a thin film transistor (typically, about 700° C. or less). ELC is a method of crystallizing an amorphous silicon material by irradiating the amorphous silicon material with an excimer laser and locally heating the amorphous silicon material to a high temperature for a very short time. MIC is a method of using phase transfer induction from amorphous silicon to polysilicon by contacting the amorphous silicon material with metals such as nickel (Ni), palladium (Pd), gold (Au), and aluminum (Al), or implanting such metals into the amorphous silicon material. MILC is a method of inducing sequential crystallization of an amorphous silicon material by lateral diffusion of silicide formed by reacting metal with silicon.

However, SPC has disadvantages of long processing time and a risk of transformation of the substrate due to the long processing time and high temperature used for the annealing. ELC has disadvantages in the expensive laser equipment is required and interfacial characteristics between a semiconductor material and a gate insulating material may be poor due to protrusions generated on the created polycrystallized surface. MIC and MILC have disadvantages in that a large amount of crystallization-inducing metal remains on the crystallized polycrystalline silicon material to increase the leakage current of a semiconductor material of a TFT.

DETAILED DESCRIPTION

Figure 1:
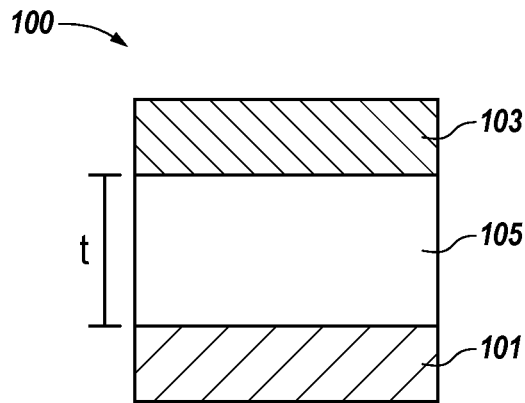
FIG. 1 illustrates an example of a select device having a semiconductor stack in accordance with one or more embodiments of the present disclosure.

Methods, devices, and systems associated with select devices are described herein. One or more select devices can include a semiconductive stack of at least one semiconductive material formed on a first electrode. The semiconductive stack can have a thickness of from about 700 angstroms (Å) or less, and each of the at least one semiconductive material can have an associated band gap of about 4 electron volts (eV) or less. A second electrode can be formed on the semiconductive stack.

Embodiments of the present disclosure can provide select devices capable of supporting increased current densities compared to prior select devices. In various embodiments, the structure of the select device can include a semiconductive stack tunable to accommodate different memory cell characteristics, such as symmetric or asymmetric current versus voltage signature, for instance. In one or more embodiments, the select devices provided can be subjected to a large number of loading cycles (e.g., 106) without experiencing a premature fatigue failure.

In the following detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

The figures herein follow a numbering convention in which the first digit corresponds to the drawing figure number and the remaining digits identify an element or component in the drawing. Similar elements or components between different figures may be identified by the use of similar digits. For example, 203 may reference element "03" in FIG. 2, and a similar element may be referenced as 303 in FIG. 3. As will be appreciated, elements shown in the various examples herein can be added, exchanged, and/or eliminated so as to provide a number of additional examples of the present disclosure. In addition, the proportion and the relative scale of the elements provided in the figures are intended to illustrate various examples of the present invention and are not to be used in a limiting sense.

Examples of a select device can include, but are not so limited to, bipolar select devices, Esaki diodes (e.g., tunnel diodes), and Schottky diodes, among others. For ease of description and by way of example, the select devices illustrated in the figures will be described in terms of a bipolar select device, though embodiments according to the present disclosure are not so limited.

FIG. 1 illustrates an example of a bipolar select device 100 formed in accordance with one or more embodiments of the present disclosure. In this example, the bipolar select device 100 includes a semiconductive stack 105 formed on a first electrode 101. As used herein, a semiconductive stack (e.g., 105) includes one or more semiconductive materials formed in a stacked configuration (e.g., in a number of layers or otherwise). As used herein, semiconductive materials can include semi-insulative materials. In one or more embodiments, the bipolar select device 100 can serve as a select device for a memory cell such as a resistive random access memory (RRAM) cell. Although embodiments are not so limited, the select device 100 can be a diode, for instance.

In the example illustrated in FIG. 1, the semiconductive stack 105 includes a single semiconductive material 105 having a thickness (t) formed on a first electrode 101. A second electrode 103 is formed on the semiconductive stack 105. The first electrode 101 and/or the second electrode 103 can include a metal material, for example. The metal material can include titanium, titanium nitride (TiN), platinum (Pt), tungsten (W), tungsten nitride (WN), ruthenium (Ru), and/or iridium (Ir), and/or combinations thereof, among other metal materials. The first electrode 101 and second electrode 103 can be made of the same or different materials and can have the same or different physical configuration. That is, the electrodes 101 and 103 can be symmetric or asymmetric. In one example, the first electrode 101 can be TiN and the second electrode 103 can be ruthenium (Ru). The first and/or second electrodes 101 and 103 can be formed as a plug within a dielectric material such as silicon nitride (SiN), for example. Embodiments are not limited to electrodes comprising particular materials or to electrodes having a particular physical configuration. For instance, the particular materials and or physical configuration of the electrodes can depend on factors such as the characteristics of the semiconductive stack 105 and/or a desired current density through the select device 100, among other factors.

The semiconductive material 105 formed on the first electrode 101 can be various semiconductive materials, such as silicon (Si), germanium (Ge), silicon carbide (SiC), gallium nitride (GaN), indium gallium nitride (InGaN), and/or aluminum gallium nitride (AlGaN), among others. The semiconductive material 105 can comprise, for example, an amorphous semiconductive material. An amorphous semiconductive material can refer to a semiconductive material that lacks the long-range order characteristics of a crystal.

In one or more embodiments, the semiconductive material 105 has a thickness (t) of about 700 angstroms or less and can have an associated band gap of about 4 eV or less. As used herein, a band gap (e.g., energy band gap) refers to the energy difference between a top of the valence band and a bottom of the conduction band associated with a particular material.

Figure 2:
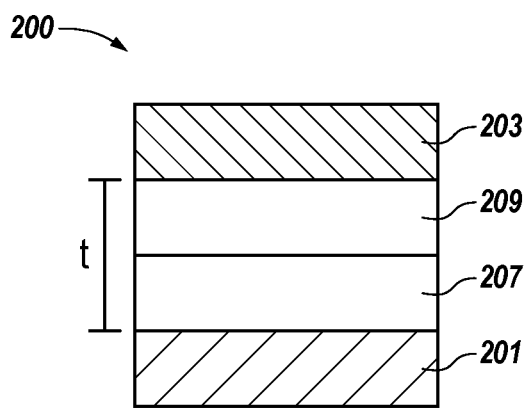
FIG. 2 illustrates an example of a select device having a semiconductor stack in accordance with one or more embodiments of the present disclosure.

FIG. 2 illustrates an example of a bipolar select device 200 formed in accordance with one or more embodiments of the present disclosure. In this example, the bipolar select device 200 includes a semiconductive stack having a thickness (t) that includes two semiconductive materials 207 and 209, where semiconductive material 207 is formed on a first electrode 201. The semiconductive material 209 is formed on the semiconductive material 207, and a second electrode 203 is formed on the semiconductive material 209. In various embodiments, the electrodes 201, 203 are metal electrodes.

In one or more embodiments, the material 209 of the semiconductive stack can be an amorphous semiconductive material 209 and the semiconductive material 207 can be a partially nanocrystallized semiconductive material 207. The term nanocrystallized includes materials that have small grains of crystalline material within the amorphous phase of the material, including materials around the transition region from amorphous to microcrystalline phase of the material. Alternatively, the material 209 of the semiconductive stack of the bipolar select device 200 can be a partially nanocrystallized semiconductive material 209 and the material 207 can be an amorphous semiconductive material 207. For example, in one or more embodiments the percentage crystallized of the partially nanocrystallized semiconductive material can be between 0% and 50% nanocrystallized.

As an example, the two semiconductive materials 207, 209 can have the same thickness (e.g., each of the materials 207, 209 can have a thicknesses of t/2). However, embodiments are not limited to particular thicknesses of materials 207 and 209. The particular materials 207 and 209 of the semiconductive stack, as well as their respective thicknesses, can depend on various factors, for example the desired current density through the select device 200 and/or a memory cell associated therewith. Similarly, the particular materials and/or physical configuration of the electrodes 201 and 203 can depend on various factors, for example the desired current density through the select device 200 and/or a memory cell associated therewith.

As such, one or more bipolar select devices (e.g., 100, 200, 300) according to the present disclosure can be "tunable" to accommodate particular characteristics. As an example, factors of the bipolar select device 200 that can effect its associated current density can include the barrier height (e.g., Schottky barrier height) between the semiconductive materials 207, 209 and the electrodes 201, 203, the work function of the metal electrodes 201, 203, the dielectric constants of the semiconductive materials 207, 209, and the effective electron mass of the materials 207, 209, among other factors. Therefore, the configuration of bipolar select devices can be tuned to achieve desired current density and/or leakage current characteristics, for instance.

In one or more embodiments, the bipolar select device can be tuned by adjusting the thickness of the semiconductive stack within in a range of from about 100 Å to about 500 Å. For example, a semiconductive stack of about 500 Å can have an amorphous semiconductive material of about 200 Å and a partially nanocrystallized semiconductive material of about 300 Å. In various embodiments, the anneal can be performed at low temperature processes in a range of from about 500° C. to about 700° C. to tune the bipolar select device. Such embodiments can provide benefits associated with Schottky barriers formed at a metal-semiconductor junction. In one or more embodiments, the bipolar select device can be a tunneling based diode (e.g., Esaki diode), and can have the numerous characteristics of such devices as are commonly known in the art.

Figure 3:
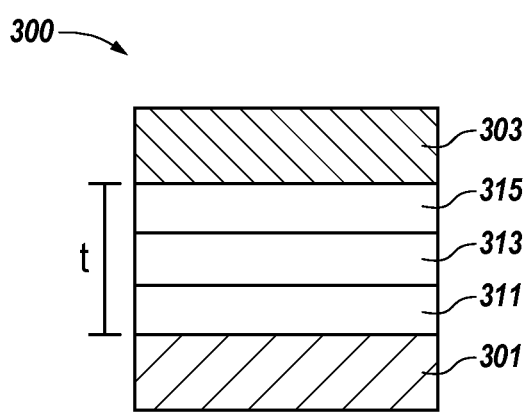
FIG. 3 illustrates an example of a select device having a semiconductor stack in accordance with one or more embodiments of the present disclosure.

FIG. 3 illustrates an example of a bipolar select device 300 formed in accordance with one or more embodiments of the present disclosure. In this example, the bipolar select device 300 includes a semiconductive stack having a thickness (t) and including three semiconductive materials 311, 313, and 315 formed on a first electrode 301. The semiconductive material 313 is formed on semiconductive material 311, semiconductive material 315 is formed on semiconductive material 313, and a second electrode 303 is formed on the semiconductive material 315. Select devices of more than three semiconductive materials are contemplated.

As an example, semiconductive material 311 can be a first partially nanocrystallized semiconductive material, semiconductive material 313 can be an amorphous semiconductive material, and semiconductive material 315 can be a second partially nanocrystallized semiconductive material. In another example, semiconductive material 311 can be a first amorphous semiconductive material, semiconductive material 313 can be a partially nanocrystallized semiconductive material, and semiconductive material 315 can be a second amorphous semiconductive material. Other stack arrangements are contemplated. In the example shown in FIG. 3, the bipolar select device 300 can be referred to as a symmetrical bipolar select device since the semiconductive materials (e.g., 311 and 315) abutting the electrodes 301 and 303 are the same material (e.g., amorphous semiconductive material or partially nanocrystallized semiconductive material). Symmetrical bipolar select devices can create a symmetrical current density versus voltage curve, which can be beneficial in their predictability during operation, among other benefits.

In various embodiments, the bipolar select device 100, 200, 300 can be formed at a temperature of about 500° C. or less. The semiconductive materials 105 in FIG. 1, 207 and 209 in FIG. 2, and 311, 313, 315 in FIG. 3 can be formed via various techniques such as, but not limited to, physical vapor deposition (PVD), chemical vapor deposition (CVD), electrochemical deposition (ECD), molecular beam epitaxy (MBE), pulsed laser deposition (PLD), microwave CVD, anneal, and atomic layer deposition (ALD).

Forming the semiconductive stack of the bipolar select device 200, 300 can include doping at least one of the semiconductive materials (e.g., 207, 209 in FIG. 2, and 311, 313, 315 in FIG. 3) of the semiconductive stack with a crystallization retardant such as carbon (C), oxygen (O), and/or nitrogen (N), for instance. Forming the semiconductive stack can also include doping at least one of the semiconductive materials (e.g., 207, 209 in FIG. 2, and 311, 313, 315 in FIG. 3) of the semiconductive stack with a material such as germanium (Ge), for instance, to promote crystallinity. Other examples of crystallinity promoters include nickel (Ni), palladium (Pd), silver (Ag), gold (Au), aluminum (Al), tin (Sn), antimony (Sb), copper (Cu), terbium (Tb), and cadmium (Cd). In one or more embodiments, the doping of the semiconductive stack with a crystallization retardant and a crystallinity promoter can occur simultaneously or substantially simultaneously. For instance, in an example in which material 313 is a partially crystallized semiconductive material and the materials 311 and 315 are amorphous semiconductive materials, the material 313 can be doped with a crystallization promoter and the materials 311 and 315 can be doped with a crystallization retardant.

In various embodiments, forming the semiconductive stack can include performing an anneal prior to forming the second electrode (e.g, 103, 203, 303). The anneal can alter at least one of the semiconductor materials. For example, the anneal can alter the at least one semiconductive material doped with the crystallinity promoter to a partially nanocrystallized semiconductive material. Further, because at least one semiconductive material has been doped with the crystallization retardant, at least one semiconductive material will remain an amorphous semiconductive material. Lowering the concentrations of the crystallinity promoter can increase the grain size of the crystalline semiconductor material produced (e.g., by spacing out the sites from which crystallization proceeds). In an example, the anneal can be done at a temperature of about 500° C. or less; however, embodiments are not so limited. For example, in one or more embodiments of the present disclosure the anneal can be done at a temperature in a range of from about 500° C. to about 700° C. for a range of from 1 millisecond to 20 minutes.

In operation, one or more bipolar select devices in accordance with embodiments described herein can be operated by application of a voltage across the semiconductive stack formed between the first electrode and the second electrode. The applied voltage across the semiconductive stack can, in an example, produce a current density of at least about 1.0× 106 J·A/cm2 across the bipolar select device. In one or more embodiments, a current density of at least about 1.0×106 J·A/cm2 is achieved responsive to an applied voltage of about 3 volts of less.

Figure 4:
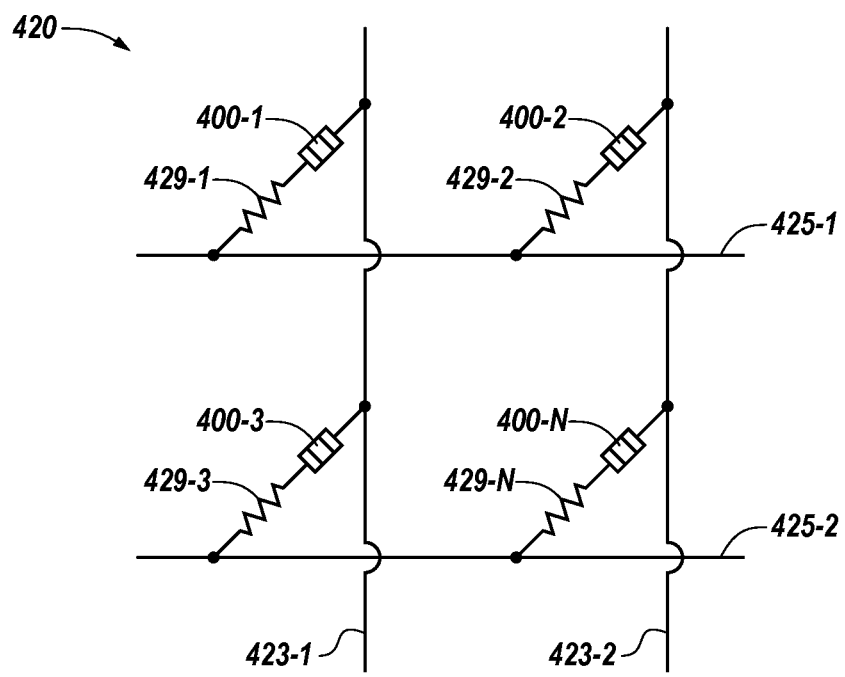
FIG. 4 illustrates an example of a cross-point memory array including at least one select device in accordance with one or more embodiments of the present disclosure.

FIG. 4 is illustrates an example of a cross-point memory array 420 including at least one bipolar select device in accordance with one or more embodiments of the present disclosure. The cross-point memory array 420 can include a first number of conductive lines 423-1, 423-2 and a second number of conductive lines 425-1, 425-2 that intersect the first number of conductive lines 423-1, 423-2. Although FIG. 4 shows two conductive lines 423-1, 423-2 and two conductive lines 425-1, 425-2, examples are not limited to a particular number of conductive lines. The first number of conductive lines 423-1, 423-2 can, in an example, be access lines (e.g., word lines) and the second number of conductive lines 425-1, 425-2 can be data lines (e.g., bit lines). The first number of conductive lines 423-1, 423-2 and/or the second number of conductive lines 425-1, 425-2 can be comprised of copper, among various other conductive materials. The cross-point memory array 420 can be an RRAM array, for example, and can be constructed on a bulk silicon integrated circuit (IC). In an example, one or more additional crosspoint memory arrays can be stacked on the cross-point memory array 420.

As illustrated in FIG. 4, the array 420 includes a number of bipolar select devices 400-1, 400-2, 400-3, . . . 400-N located at each of the number of intersections of the conductive lines 423-1, 423-2 and the conductive lines 425-1, 425-2. Each of the number of bipolar select devices 400-1, 400-2, 400-3, . . . 400-N is connected to a variable resistance element 429-1, 429-2, 429-3, . . . 429-N. The variable resistance elements 429-1, 429-2, 429-3, . . . 429-N can include various types of resistance variable including transition metal oxides, chalcogenides, and perovskites, among other resistance variable materials. The bipolar select devices 400-1, 400-2, 400-3, . . . 400-N can be select devices such as described above in connection with FIGS. 1-3.

Although specific examples have been illustrated and described herein, those of ordinary skill in the art will appreciate that an arrangement calculated to achieve the same results can be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and methods are used. Therefore, the scope of one or more examples of the present disclosure should be determined with reference to the appended claims, along with the full range of equivalents to which such claims are entitled.

Throughout the specification and claims, the meanings identified below do not necessarily limit the terms, but merely provide illustrative examples for the terms. The meaning of "a," "an," and "the" includes plural reference, and the meaning of "in" includes "in" and "on." The term "a number of" is meant to be understood as including at least one but not limited to one. The phrase "in an example," as used herein does not necessarily refer to the same example, although it can.

In the foregoing Detailed Description, various features are grouped together in a single example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a single disclosed example. Thus, the following claims are hereby incorporated into the Detailed Description, with each claim standing on its own as a separate example.

What is claimed is:

1. A select device, comprising:
    a semiconductive stack including at least one semiconductive material formed on a first electrode, wherein the semiconductive stack has a thickness of 700 angstroms or less, and wherein each of the at least one semiconductive material has an associated band gap of 4 electron volts or less, and wherein the at least one semiconductive material is a first partially nanocrystallized semiconductive material and the semiconductive stack includes an amorphous semiconductive material formed on the first partially nanocrystallized semiconductive material, and a second partially nanocrystallized semiconductive material formed on the amorphous semiconductive material; and
    a second electrode formed on the semiconductive stack.

2. The select device of claim 1, wherein the bipolar select device is formed at a temperature of 700 degrees Celsius or less.

3. The select device of claim 1, wherein the semiconductive stack includes at least one material from the group including: Si, Ge, SiC, GaN, InGaN, and AlGaN.

4. The select device of claim 1, wherein the semiconductive stack includes a single amorphous material.

5. The select device of claim 1, wherein the first partially nanocrystallized semiconductive material has a first thickness and the amorphous semiconductive material has a second thickness.

6. The select device of claim 5, wherein the second partially nanocrystallized semiconductive material formed on an amorphous semiconductive material has a third thickness and the first thickness, the second thickness, and the third thickness have a combined thickness of 700 angstroms or less.

7. The select device of claim 1, wherein at least one semiconductive material of the semiconductive stack is doped with a crystallization retardant.

8. The select device of claim 1, wherein at least one semiconductive material of the semiconductive stack is doped with Ge to promote crystallinity.

9. The select device of claim 1, wherein at least one of the first electrode and the second electrode is a metal material.

10. The select device of claim 1, wherein at least one of the first electrode and the second electrode is a metal nitride material.

11. A bipolar select device, comprising:
    a semiconductive stack formed on a first electrode, the semiconductive stack including an amorphous semiconductive material located between a first partially nanocrystallized semiconductive material and a second partially nanocrystallized semiconductive material, wherein the first partially nanocrystallized semiconductive material abuts the first electrode and the semiconductive stack has a thickness of 700 angstroms or less; and
    a second electrode formed on the semiconductive stack, wherein the second partially nanocrystallized semiconductive material abuts the second electrode.

12. A symmetrical bipolar select device, comprising:
    a semiconductive stack formed on a first electrode, the semiconductive stack including a an amorphous semiconductive material located between a plurality of partially nanocrystallized semiconductive materials each having a nanocrystallization of fifty percent or less, wherein the semiconductive stack has a thickness of 700 angstroms or less, and wherein the partially nanocrystallized semiconductive material the amorphous semiconductive material each has an associated band gap of 4 electron volts or less; and
    a second electrode formed on the semiconductive stack.

13. A bipolar select device, comprising:
    a semiconductive stack formed on a first electrode, the semiconductive stack including a first partially nanocrystallized semiconductive material, an amorphous semiconductive material, and a second partially nanocrystallized semiconductive material, wherein the semiconductive stack has a thickness of 700 angstroms or less, and wherein each material of the semiconductive stack has an associated band gap of 4 electron volts or less; and
    a second electrode formed on the semiconductive stack.

14. The bipolar select device of claim 13, wherein the first partially nanocrystallized semiconductive material is formed on the first electrode, the amorphous semiconductive material is formed on the first partially nanocrystallized semiconductive material, and the second partially nanocrystallized semiconductive material is formed on the amorphous semiconductive material.

15. A symmetrical bipolar select device, comprising:
    a semiconductive stack formed on a first electrode, the semiconductive stack including an amorphous semiconductive material located between a first partially nanocrystallized semiconductive material and a second partially nanocrystallized semiconductive material, wherein the symmetrical bipolar select device provides a symmetrical current density versus voltage curve and the semiconductive stack has a thickness of 700 angstroms; and
    a second electrode formed on the semiconductive stack.

16. The bipolar select device of claim 15, wherein the first amorphous semiconductive material is formed on the first electrode, and the partially nanocrystallized semiconductive material is formed on the first amorphous semiconductive material, and the second amorphous semiconductive material is formed on the partially nanocrystallized semiconductive material.

17. A method of forming a bipolar select device, comprising:
    forming a semiconductive stack having a thickness of 700 angstroms or less on a first electrode, wherein each material of the semiconductive stack has an associated band gap of 4 electron volts or less;
    doping at least one semiconductive material of the semiconductive stack with a crystallization retardant;
    doping at least one semiconductive material of the semiconductive stack with Ge to promote crystallinity;

performing an anneal of the semiconductive stack at an anneal temperature of 500 degrees Celsius of less before forming the second electrode on the semiconductive stack; and forming a second electrode on the semiconductive stack.

18. The method of claim 17, wherein forming the semiconductive stack includes forming an amorphous semiconductive material on the first electrode.

19. A method of claim 17, wherein forming the semiconductive stack includes forming an amorphous semiconductive material on the first electrode and a partially nanocrystallized semiconductive material on the amorphous semiconductive material.

20. The method of claim 17, wherein forming the semiconductive stack includes forming a partially nanocrystallized semiconductive material on the first electrode and an amorphous semiconductive material on the partially nanocrystallized semiconductive material.

21. The method of claim 17, wherein forming the semiconductive stack includes forming a first partially nanocrystallized semiconductive material on the first electrode, an amorphous semiconductive material on the first partially nanocrystallized semiconductive material, and a second partially nanocrystallized semiconductive material on the amorphous semiconductive material.

22. The method of claim 17, wherein forming the semiconductive stack includes forming a first amorphous semiconductive material on the first electrode, a partially nanocrystallized semiconductive material on the first amorphous semiconductive material, and a second amorphous semiconductive material on the partially nanocrystallized material.

23. The method of claim 17, including forming the bipolar select device at a temperature of 500 degrees Celsius or less.

24. The method of claim 17, wherein doping the at least one semiconductive material of the semiconductive stack with a crystallization retardant includes at least one dopant of C, O, and N.

25. The method of claim 17, wherein forming the first electrode and the second electrode includes forming at least one of the first electrode and the second electrode from a metal material.

26. The method of claim 17, wherein forming the first electrode and the second electrode includes forming at least one of the first electrode and the second electrode from a metal nitride material.

27. A cross-point memory array, comprising:
a first number of conductive lines;
a second number of conductive lines intersecting the first number of conductive lines; and
a bipolar select device at each of the number intersections of the first number and the second number of conductive lines, wherein the bipolar select device includes:
a semiconductive stack having a thickness of 700 angstroms or less and including at least one semiconductive material formed on a first electrode, wherein each semiconductive material of the semiconductive stack has an associated band gap of 4 electron volts or less, and wherein the at least one semiconductive material is a first partially nanocrystallized semiconductive material and the semiconductive stack includes an amorphous semiconductive material formed on the first partially nanocrystallized semiconductive material, and a second partially nanocrystallized semiconductive material formed on the amorphous semiconductive material; and
a second electrode formed on the semiconductive stack.

28. The memory array of claim 27, wherein the first number of conductive lines are access lines and the second number of conductive lines are data lines.

29. The memory array of claim 27, wherein the first partially nanocrystallized semiconductive material has a first thickness and the amorphous semiconductive material has a second thickness.

30. The memory array of claim 29, wherein the second partially nanocrystallized semiconductive material has a third thickness and the first thickness, the second thickness, and the third thickness have a combined thickness of 700 angstroms or less.

31. The memory array of claim 27, wherein at least one semiconductive material of the semiconductive stack is doped with a crystallization retardant and at least one semiconductive material of the semiconductive stack is doped with Ge to promote crystallinity.

* * * * *